United States Patent
Watanabe et al.

(10) Patent No.: US 7,024,347 B2
(45) Date of Patent: Apr. 4, 2006

(54) TRANSACTION CONFLICT TESTING METHOD AND APPARATUS

(75) Inventors: Isao Watanabe, Hadano (JP); Kaoru Suzuki, Fujisawa (JP); Atsushi Kawai, Hadano (JP)

(73) Assignee: Hitachi, Ltd., Tokyo (JP)

(*) Notice: Subject to any disclaimer, the term of this patent is extended or adjusted under 35 U.S.C. 154(b) by 832 days.

(21) Appl. No.: 09/908,712

(22) Filed: Jul. 20, 2001

(65) Prior Publication Data

US 2002/0026303 A1    Feb. 28, 2002

(30) Foreign Application Priority Data

Jul. 21, 2000    (JP)    ............... 2000-226184

(51) Int. Cl.
*G06F 9/455*    (2006.01)
(52) U.S. Cl. ............... 703/23; 703/27; 703/28; 703/2; 703/13; 703/16; 707/102
(58) Field of Classification Search ............... 703/13, 703/23, 24, 25; 716/1
See application file for complete search history.

(56) References Cited

U.S. PATENT DOCUMENTS 5,600,579 A * 2/1997 Steinmetz, Jr. ............... 703/13
5,819,066 A * 10/1998 Bromberg et al. ............ 707/102
6,061,725 A * 5/2000 Schwaller et al. ............ 709/224
6,408,335 B1 * 6/2002 Schwaller et al. ............ 709/224
6,477,683 B1 * 11/2002 Killian et al. ................ 716/1
6,484,135 B1 * 11/2002 Chin et al. ................... 703/23
6,502,102 B1 * 12/2002 Haswell et al. .............. 707/102
6,832,184 B1 * 12/2004 Bleier et al. ................. 703/23

FOREIGN PATENT DOCUMENTS

| JP | A-5-81150 | 4/1993 |
| JP | A-10-105525 | 4/1998 |

OTHER PUBLICATIONS

"A Virtual Machine Emulator for Performance Evaluation", M.D. Cannon et al, Seventh Symposium on Operating Systems Principles, 1980 ACM.*
"Emulation—A Useful Toll in the Development of Computer Systems", F.A. Salomon et al, 15th Annual Simulation Symposium, Mar. 1982, ACM.*

* cited by examiner

*Primary Examiner*—Fred Ferris
(74) *Attorney, Agent, or Firm*—Mattingly, Stanger, Malur & Brundidge, P.C.

(57) ABSTRACT

In verifying a logic operation of an information processing apparatus, an I/O emulator and a test program are operated in cooperation with each other and input data to the I/O emulator is automatically generated to generate more transaction conflict patterns and realize verification of the logic operation at a high precision.

5 Claims, 7 Drawing Sheets

FIG.4

```
GR12 = 0x11223344
GR13 = 0x55667788
GR14 = 0xaabbccdd
store8  GR12 at 0x00200000
 load4  GR15 at 0x00200004
and
store4  GR13 at 0x04444000
shift
load4   GR16 at 0x04444000
store8  GR14 at 0x04445000
load1   GR17 at 0x04445000
and
load1   GR17 at 0x04445001
    .
    .
    .
```

FIG.5

| type | address    | size |
|------|------------|------|
| st   | 0x00200000 | 8    |
| ld   | 0x00200004 | 4    |
| st   | 0x04444000 | 4    |
| ld   | 0x04444000 | 4    |
| st   | 0x04445000 | 8    |
| ld   | 0x04445000 | 1    |
| ld   | 0x04445001 | 1    |
|      | .          |      |
|      | .          |      |
|      | .          |      |

FIG.6

```
loop :
write8  0x04440500
write2  0x00200240
read8   0x04440500
write8  0x04440118
read8   0x04440118
read2   0x00200240
write8  0x00200a20
write8  0x04440fe0
read8   0x00200a20
write8  0x04440420
read8   0x04440fe0
write4  0x04440cec
read8   0x04440420
read4   0x04440cec
     •
     •
     •
```

FIG.7

```
TMP_0000A  V/R=02/07  Start  2000/3/10  00:02:15
make random:00000001
RTN START  1
RTN END 00000001 OK
make random:409AFADA
RTN START 2
RTN END 409AFADA NG  *
       MEM_compare OK
       GR_compare NG *

GRO2 *
                              EXP : 0X11223344
                              ACT : 0X11220000
                              GRO5 *
                              EXP : 0xaabbccdd
                              ACT : 0xddccbbaa FR_compare OK
       SYS_compare OK
make random:3A4F521F
RTN START 3
RTN END 3A4F521F OK
TMP_0000A  V/R=02/07 End   2000/3/10  01:04:45
```

FIG.8

```
sim_start : 2000/03/10  14:56:34
     memory_check 00# OK
     memory_check 01# OK
     memory_check 02# OK
     memory_check 03# OK
*    memory_check 04# NG ADDR : 0x23040100
          EXP  : 0x11335577
          ACT  : 0x11330077 memory_check 05# OK
     memory_check 06# OK sim_end : 2000/03/10  15:23:33
exe_time : 1800
```

TRANSACTION CONFLICT TESTING METHOD AND APPARATUS

BACKGROUND OF THE INVENTION

The present invention relates to a logic verification method for an information processing apparatus, and more particularly to a method of verifying a logic operation of an information processing apparatus of a multi processor type.

As one of logic verification methods for an information processing apparatus, a method is known by which instructions are executed to generate transactions by using a test program and verify a transaction operation.

SUMMARY OF THE INVENTION

According to a conventional logic verification method of verifying a transaction operation of an information processing apparatus, transactions are issued from a processor by using a test program so that there is a limit of transaction conflict patterns to be generated.

It is an object of the present invention to realize high precision verification of a logic operation of an information processing apparatus by generating more transaction conflict patterns under the conditions that a pseudo input/output apparatus (hereinafter called an I/O emulator) and a test program are made to operate in cooperation with each other and that input data to the I/O emulator is automatically generated.

According to the invention, there is provided a method of verifying a transaction conflict operation of an information processing apparatus having a processor and a memory, by using I/O emulators, the method comprising the steps of: forming test instructions from test programs executed by processors; forming I/O emulator script commands to be executed by I/O emulators and being related to the test instructions, from the test instructions; executing test instructions and generating each transaction from processors; and executing the I/O emulator script commands and generating each transaction from I/O emulators.

BRIEF DESCRIPTION OF THE DRAWINGS

FIG. 4 is a diagram showing an output example of test instructions.

FIG. 5 is a diagram showing an output example of a memory access list.

FIG. 6 is a diagram showing an output example of I/O emulator script commands.

FIG. 7 is a diagram showing output examples of a test program without I/O emulator verification result and a test program with I/O emulator verification result.

FIG. 8 is a diagram showing output examples of an I/O emulator without test program verification result and an output I/O emulator with test program verification result.

DETAILED DESCRIPTION OF THE EMBODIMENTS

Related arts to this invention include the publications of JP-A-10-105525 and JP-A-5-81150. The former art is characterized in that when a network communication conflict test is made between a plurality of processors, all processors execute various data transfers by using random numbers to check whether data is transferred correctly. The latter art relates to a channel function test which is made by connecting a pseudo input/output apparatus to the channel.

According to an embodiment of the invention, a processor side and an I/O side generate a large number of various transactions at the same time and various transaction conflict patterns can be generated with ease, which are difficult to be generated by prior arts. It is also possible for the I/O side to automatically generate transactions most suitable for transactions generated from the processor side. It is therefore possible to provide a method of verifying a logic operation of an information processing apparatus at a high precision.

An embodiment of the invention will be described in detail.

Figure 1:
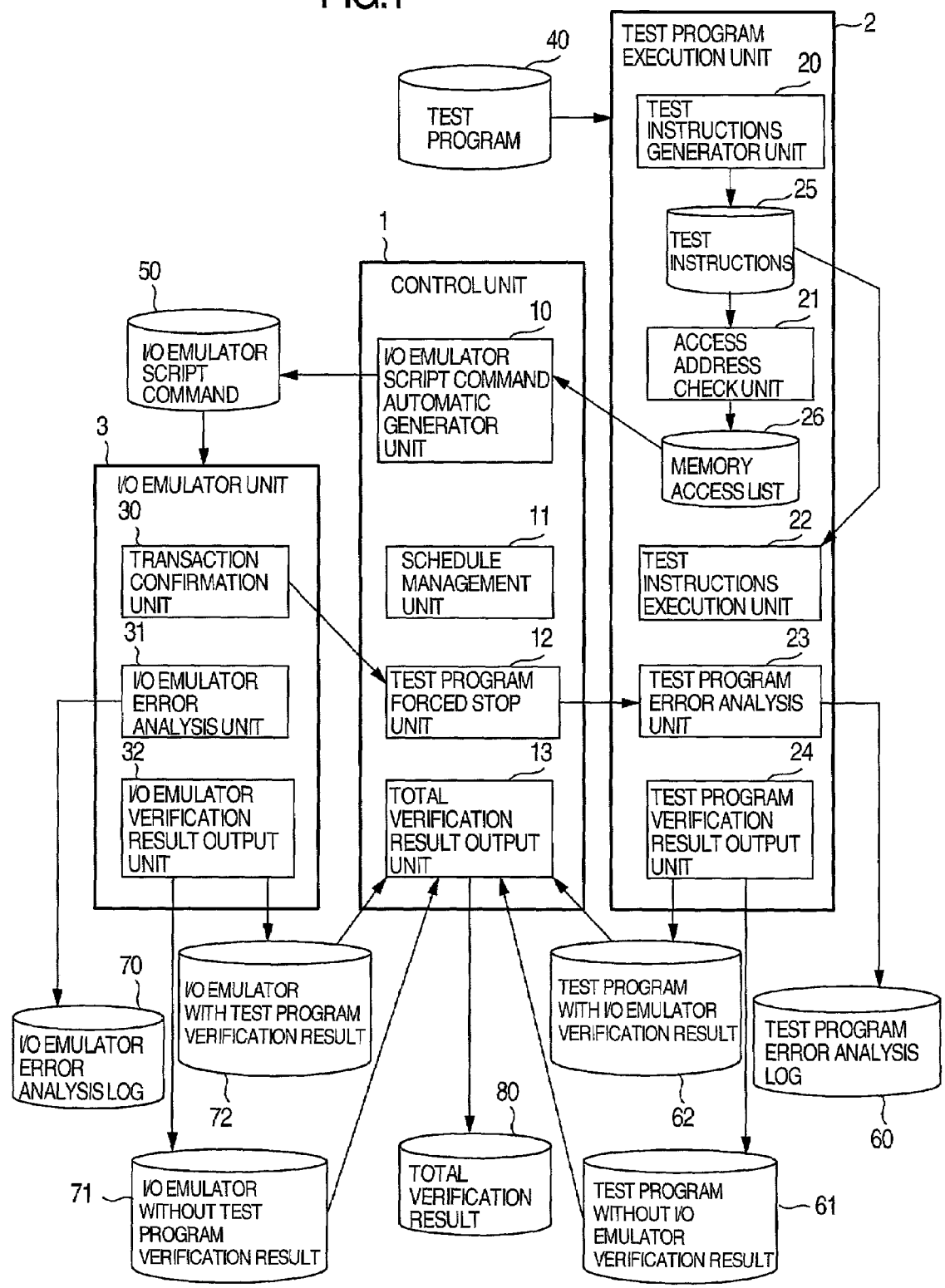
FIG. 1 shows an example of the structure of a logic verification method according to an embodiment of the invention.

FIG. 1 shows an example of the structure of a logic verification method according to an embodiment of the invention.

A control unit 1 has an I/O emulator script commands automatic generator 10, a schedule management unit 11, a test program forced stop unit 12, and a total verification result output unit 13.

A test program execution unit 2 has a test instructions generator unit 20, an access address check unit 21, a test instructions execution unit 22, a test program error analysis unit 23, and a test program verification result output unit 24.

An I/O emulator unit 3 has a transaction confirmation unit 30, an I/O emulator error analysis unit 31, and an I/O emulator verification result output unit 32.

Under a multi processor environment, the schedule management unit 11 loads a test program 40 in memory spaces and activates the test program execution units 2 of all processors. In the activated test program execution unit 2 of each processor, the test instructions generator unit 20 automatically generates test instructions 25. An output example of test instructions 25 is shown in FIG. 4.

The test instructions 25 can be generated randomly and automatically by using random numbers. The generated test instructions 25 is analyzed by the access address check unit 21. Addresses of the access destinations of a plurality of transactions to be generated by the test instructions 25 are stored in a memory access list 26 which is sent to the I/O emulator script commands automatic generator unit 10. An output example of the memory access list 26 is shown in FIG. 5.

Upon reception of the memory access list 26 from the access address check unit 21 of each of all processors, the I/O emulator script commands automatic generator unit 10 automatically generates an I/O emulator script commands 50 most suitable for the plurality of test instructions 25, by using the plurality of memory access lists 26. An output example of the I/O emulator script commands 50 is shown in FIG. 6.

The most suitable I/O emulator script commands 50 is, for example, the script commands that the addresses of transactions to be generated from the test instructions 25 are not duplicated and that some bits of the address values are coincident. Several patterns for generating the I/O emulator script commands 50 may be prepared to allow a user to optionally designate the pattern. The I/O emulator script commands 50 are generated as many as the number of activated I/O emulators 3.

After the I/O emulator script commands 50 are generated, the schedule management unit 11 activates the test instructions execution unit 22 of each of a plurality of processors. At this time, the I/O emulator unit is not still activated. Each of the activated test instructions execution units 22 generates expected values of a memory state after the test, register values in the processor, and register values in the information processing apparatus, and thereafter, all the processors execute test instructions 25 at the same time by using a synchronous process. The synchronous process may be executed by the schedule management unit 11. After all instructions of the test instructions 25 are executed, each test instructions execution unit 22 generates the actual values of the memory state after the test, register values of the processor, and register values of the information processing apparatus. After the actual values are generated, the test program verification result output unit 24 checks a difference between the actual values and expected values, and outputs the check contents as a test program without I/O emulator verification result 61. An output example of the test program without I/O emulator verification result 61 is shown in FIG. 7. As the method of outputting the test program without I/O emulator verification result 61, there are a method of outputting a plurality of test results from the test program verification result output units 24 of all processors and a method of outputting one test result from the test program verification result output unit 24 of a representative single processor. After the test program without I/O emulator verification results 61 are output, the test program execution units 2 notify the output completion to the schedule management unit 11.

After the outputs of the test program without I/O emulator verification results 61, the schedule management unit 11 makes the memory state and register values in the information processing apparatus have values before each test instructions execution unit 22 is activated, loads a plurality of I/O emulator script commandss 50 in the I/O emulator units 3, and synchronously activates the I/O emulator units 3. In this case, the test instructions execution units 22 of all processors are not activated. Each activated I/O emulator unit 3 generates expected values of a memory state after execution and register values in the information processing apparatus. The I/O emulator script commands automatic generator unit 10 may prepare beforehand the expected values. After all the I/O emulator script commands 50 are executed, each I/O emulator unit 3 generates actual values of the memory state after script commands execution and register values of the information processing apparatus. After the actual values are generated, each I/O emulator verification result output unit 32 checks a difference between the expected values and actual values, and outputs the check contents as an I/O emulator without test program verification result 71. FIG. 8 shows an output example of the I/O emulator without test program verification result 71. After the I/O emulator without test program verification result 71 is output, the I/O emulator unit 3 notifies the output completion to the schedule management unit 11.

The transaction confirmation unit 30 checks each transaction generated by the script. If this check detects an error of the transaction operation, the I/O emulator error analysis unit 31 outputs an I/O emulator error analysis log 70 and notifies an error detection to the control unit 1. Upon reception of a notice of the error detection from the I/O emulator unit 3, the control unit 1 activates the test program forced stop unit 12 to stop all the test program execution units 2. The control units 1 activates the I/O emulator error analysis units 31 of all the I/O emulator units 3 excepting the I/O emulator unit 3 which detected the error, to thereby make them output the I/O emulator error analysis logs 70. Thereafter, the cause of the error is inspected from the contents of the I/O emulator error analysis logs 70, so that the logic verification can be achieved. The contents of the I/O emulator error analysis log 70 are, for example, the number of script executions, transaction trace information, memory dump information, an error type and the like.

After the I/O emulator without test program verification results 71 are output, the schedule management unit 11 makes the memory state and register values in the information processing apparatus have values before each I/O emulator unit 3 is activated, loads a plurality of I/O emulator script commands 50 in each I/O emulator unit 3, and synchronously activates the test instructions execution units 22 and I/O emulator units 3. Each activated test instructions execution unit 22 generates expected values and actual values similar to the case of the test program without I/O emulator verification results 61. The test program verification result output unit 24 checks a difference between the expected values and actual values, and outputs the check contents as a test program with I/O emulator verification result 62. An output example of the test program with I/O emulators verification result 62 is shown in FIG. 7. After the test program with I/O emulator verification result 62 is output, the test program execution unit 2 notifies the output completion to the schedule management unit 11. Each activated I/O emulator unit 3 generates expected values and actual values similar to the case of the I/O emulator without test program verification result 71. The I/O emulator verification result output unit 32 checks a difference between the expected values and actual values, and outputs the check result as an I/O emulator with test program verification result 72. An output example of the I/O emulator with test program verification result 72 is shown in FIG. 8. After the I/O emulator with test program verification result 72 is output, the I/O emulator unit 3 notifies the output completion to the schedule management unit 11.

While the plurality of test instructions execution units 22 and the plurality of I/O emulator units 3 operate in parallel, each of the transaction confirmation units 30 checks each transaction generated by the script. If this check detects an error of the transaction operation, the I/O emulator error analysis unit 31 outputs an I/O emulator error analysis log 70 and notifies an error detection to the control unit 1. Upon reception of a notice of the error detection from the I/O emulator unit 3, the control unit 1 activates the test program forced stop unit 12 to stop all the test program execution units 2. In this case, if the test instructions execution unit is under execution, the test program execution unit 2 requested to stop stops the test instructions execution unit and activates the test program error analysis unit 23 to make it output the test program error analysis log 60. The control units 1 activates the I/O emulator error analysis units 31 of all the I/O emulator units 3 excepting the I/O emulator unit 3 which detected the error, to thereby make them output the I/O emulator error analysis logs 70. Thereafter, the cause of the error is inspected from the contents of the I/O emulator error analysis logs 70 and the contents of the test program error analysis logs 60, so that the logic verification can be achieved. The contents of the test program error analysis log 60 are, for example, the number of test instructions executions, memory dump information, register dump information and the like.

If all the transaction confirmation units 30 do not detect an error of each transaction operation and the output completion is notified to the schedule management unit 11 from all the test program execution units 2 and I/O emulator units 3, then the total verification result output unit 13 summarizes the test program without I/O emulator verification results 61, the test program with I/O emulator verification results 62, the I/O emulator without test program verification results 71 and the I/O emulator with test program verification results 72, and outputs a total verification result 80. Thereafter, the contents of the total verification result 80 are checked so that the logic verification can be achieved.

Figure 2:
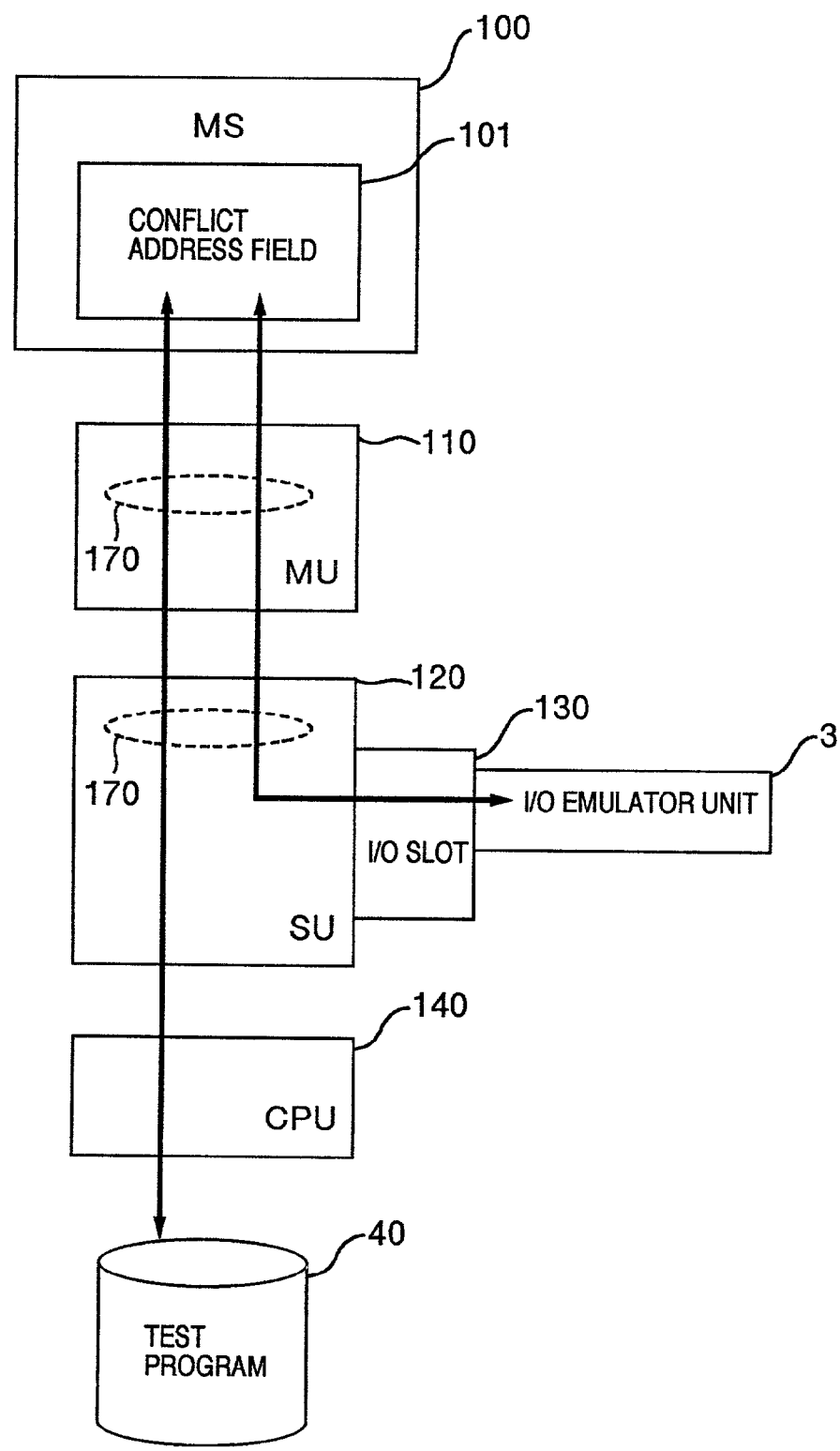
FIG. 2 shows an example of an occurrence of transaction conflicts.

FIG. 2 shows an example of an occurrence of transaction conflicts.

An MS 100 is a memory of an information processing apparatus. An MU (memory unit) 110 is a unit for managing a memory of the information processing apparatus. An SU (storage unit) 120 is a unit for managing a memory access and an I/O access of the information processing apparatus. A CPU 140 is a central processing unit.

A test program 40 running on the CPU 140 randomly generates a test instructions 25 and executes it to form each transaction and generates a memory read and a memory write from and into a conflict address field 101 in the MS 100 via the SU 120 and the MU 110. The I/O emulator unit 3 connected to an I/O slot 130 executes an I/O emulator script commands 50 which is formed by using the test instructions 25, to thereby form each transaction and generate a memory read and a memory write from and into the conflict address field 101 in the MS 100 via the SU 120 and the MU 110.

The conflict address field 101 is, for example, the address field that the access address of a transaction generated on the CPU 140 side and the access address of a transaction generated on the I/O slot 130 side are each a 32-bit address whose all bits are not coincident but only fifteenth bit to twenty first bit are coincident.

The CPU 140 side generates a number of transactions and the I/O slot 130 side also generates a number of transactions most suitable for logic verification, respectively relative to the conflict address field 101. Logic verification of the logic operations of the MU 110 and the SU 120 can therefore be achieved at a high precision by generating high load transaction conflicts 170 in the MU 110 and the SU 120.

Figure 3:
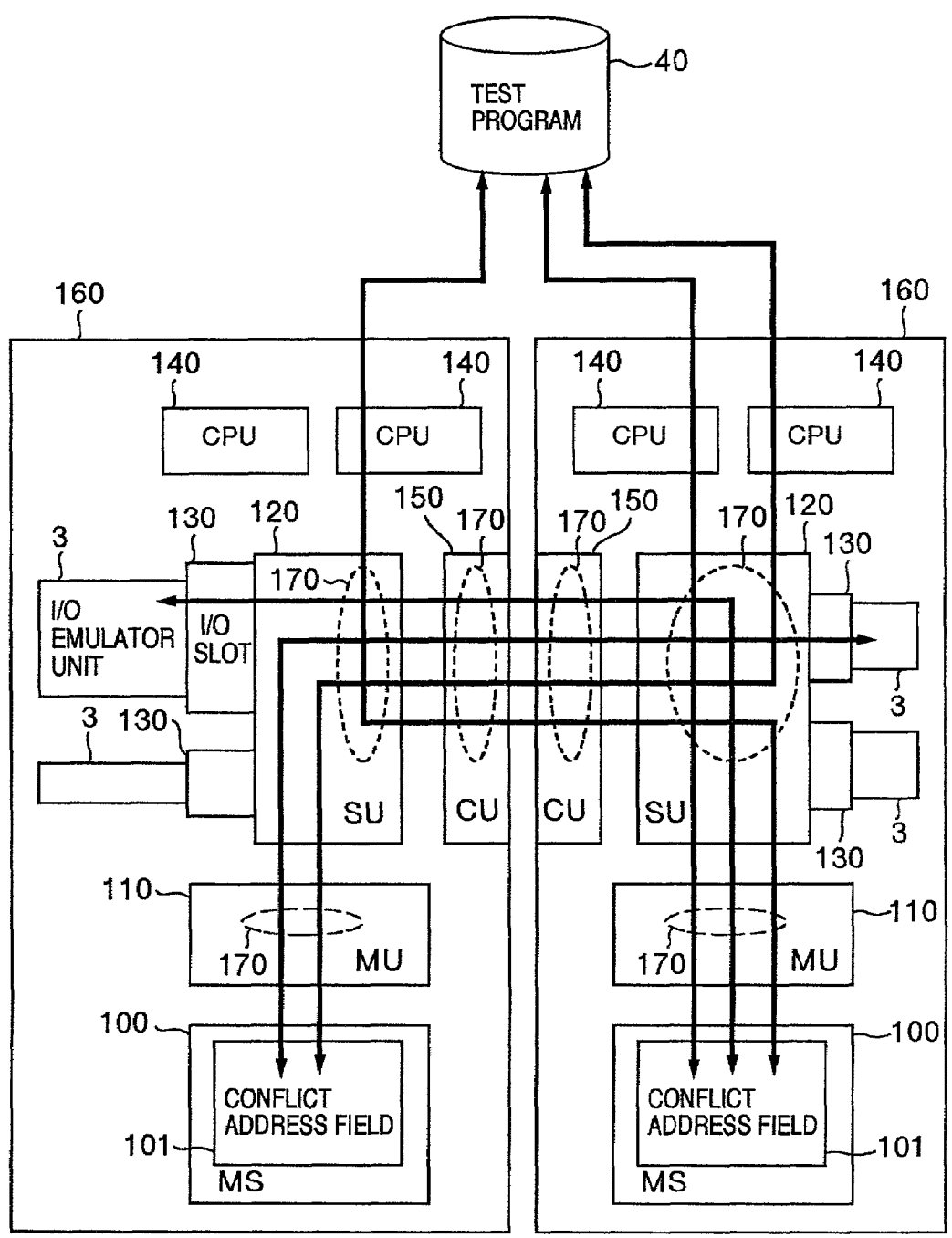
FIG. 3 shows an example of an occurrence of transaction conflicts while a multi-processor and a plurality of I/O emulators are operated.

FIG. 3 shows an example of an occurrence of transaction conflicts when a plurality of processors and a plurality of I/O emulators are operated.

A CU (control unit) 150 is a unit for managing a memory access and an I/O access between a plurality of nodes 160 of an information processing system having a fixed number of nodes 160 or being capable of scalably adding nodes 160.

A test program 40 running on each CPU 140 randomly generates a test instructions 25 and executes it to form each transaction and generate a memory read and a memory write from and into a conflict address field 101 in the MS 100 of its node 160 via the SU 120 and the MU 110 of its node. The test program 40 also generates a memory read and a memory write from and into the conflict field 101 in the MS 100 of another node 160 via the SU 120 and the CU 150 of its node 160 and via the CU 150, the SU 120 and the MU 110 of the other node 160.

Each of I/O emulator units 3 connected to a corresponding one of I/O slots 130 executes an I/O emulator script commands 50 for each I/O emulator unit 3 formed by using a corresponding one of the test instructions 25, to thereby form each transaction and generate a memory read and a memory write from and into the conflict address field 101 in the MS 100 of its node 160 via the SU 120 and the MU 110 of its node 160. Each I/O emulator unit 3 also generates a memory read and a memory write from and into the conflict field 101 in the MS 100 of another node 160, via the SU 120 and the CU 150 of its node and via the CU 150, the SU 120 and the MU 110 of the other node 160.

The CPU 140 sides generate a number of transactions and the I/O slot 130 sides also generate a number of transactions most suitable for logic verification, respectively relative to the conflict address fields 101 of a plurality of nodes 160. Logic verification of the logic operations of the MU 110, the SU 120 and the CU 150 of all nodes 160 can therefore be achieved at a high precision by generating high load transaction conflicts 170 in the MU 110 and the SU 120, and the CU 150 of all nodes 160.

As described so far, according to the invention, both the processor side and I/O side generate a number of transactions at the same time, and various transaction conflict patterns can be formed easily. It is also possible to automatically form transactions of the I/O side most suitable for transactions of the processor side. Accordingly, verification of the logic operation of an information processing apparatus can be achieved at a high precision.

What is claimed is:

1. A method of verifying a transaction conflict operation of an information processing apparatus having a processor and a memory, by using an I/O emulator, the method comprising the steps of:
   forming test instructions from a test program executed by the processor;
   forming I/O emulator script commands to be executed by the I/O emulator and being related to the test instructions, from the test instructions;
   executing the test instructions and generating each transaction from the processor; and
   executing the I/O emulator script commands and generating each transaction from the I/O emulator.
   wherein the test program runs on the information processing apparatus, and
   wherein the information processing apparatus has a plurality of nodes each having a plurality of processors, a plurality of I/O emulators and a memory, each processor of each node executes the test instructions and generates each transaction, and each I/O emulator of each node executes the I/O emulator script commands and generates each transaction.

2. A method according to claim 1, wherein each transaction generated from each processor of each node or from each I/O emulator of each node includes an access to a predetermined address field in the memory of another node.

3. A method according to claim 2, wherein each transaction generated at each node is generated at the same time.

4. An information processing apparatus having a processor and a memory, which verifies a transaction conflict operation of the information processing apparatus itself, by using an I/O emulator, the information processing apparatus comprising:
   a test program execution unit including a test instructions generator unit for generating test instructions from a test program executed by the processor and a test instructions execution unit for executing the test instructions, said test program execution unit executing the test instructions and generating each transaction from the processor;
   an I/O emulator unit for inputting and executing I/O emulator script commands and generating each transaction from the I/O emulator unit; and a control unit including an I/O emulator script commands automatic generator unit for automatically generating the I/O emulator script commands, said control unit controlling operations of said test program execution unit and said I/O emulator unit, wherein said I/O emulator script commands automatic generator unit automatically generates the I/O emulator script commands related to the test instructions generated by the test instructions generator unit, and said test program execution unit and said I/O emulator unit are operated at the same time to generate transactions from the processor and the I/O emulator unit at the same time, wherein the test program runs on the information processing apparatus, and wherein said I/O emulator unit:

includes a transaction confirmation unit for dynamically confirming an operation error of each transaction generated by said I/O emulator unit;

outputs an I/O emulator error analysis log if an error is detected; and further outputs a test program error analysis log if an error is detected while a test instructions execution unit is operated in cooperation.

5. An information processing apparatus having a processor and a memory, which verifies a transaction conflict operation of the information processing apparatus itself, by using an I/O emulator, the information processing apparatus comprising:

a test program execution unit including a test instructions generator unit for generating test instructions from a test program executed by the processor and a test instructions execution unit for executing the test instructions, said test program execution unit executing the test instructions and generating each transaction from the processor;

an I/O emulator unit for inputting and executing I/O emulator script commands and generating each transaction from the I/O emulator unit; and a control unit including an I/O emulator script commands automatic generator unit for automatically generating the I/O emulator script commands, said control unit controlling operations of said test program execution unit and said I/O emulator unit, wherein said I/O emulator script commands automatic generator unit automatically generates the I/O emulator script commands related to the test instructions generated by the test instructions generator unit, and said test program execution unit and said I/O emulator unit are operated at the same time to generate transactions from the processor and the I/O emulator unit at the same time, wherein the test program runs on the information processing apparatus, and wherein the information processing apparatus has a plurality of nodes each having a plurality of processors, a plurality of I/O emulators and a memory, each processor of each node executes the test instructions and generates each transaction, and each I/O emulator of each node executes the I/O emulator script commands and generates each transaction.

\* \* \* \* \*